(12) United States Patent
Fan

(10) Patent No.: US 6,818,978 B1
(45) Date of Patent: Nov. 16, 2004

(54) BALL GRID ARRAY PACKAGE WITH SHIELDING

(75) Inventor: Chun Ho Fan, Sham Tseng (HK)

(73) Assignee: Asat Ltd., New Territories (HK)

( * ) Notice: Subject to any disclaimer, the term of this patent is extended or adjusted under 35 U.S.C. 154(b) by 0 days.

(21) Appl. No.: 10/299,622

(22) Filed: Nov. 19, 2002

(51) Int. Cl.$^7$ .......................... H01L 23/02; H01L 23/34
(52) U.S. Cl. ...................... 257/686; 257/777; 257/723; 257/685
(58) Field of Search .................. 257/685, 686, 257/777, 784, 723, 786, 787, 737, 738, 508, 659, 660, 773

(56) References Cited

U.S. PATENT DOCUMENTS

| | | | |
|---|---|---|---|
| 5,637,916 A | * | 6/1997 | Joshi |
| 6,072,122 A | * | 6/2000 | Hosoya |
| 6,222,265 B1 | * | 4/2001 | Akram et al. |
| 6,281,581 B1 | * | 8/2001 | Desai et al. |
| 6,410,981 B2 | * | 6/2002 | Tao |
| 6,545,365 B2 | * | 4/2003 | Kondo et al. |
| 6,569,712 B2 | * | 5/2003 | Ho et al. |
| 6,593,647 B2 | * | 7/2003 | Ichikawa |
| 6,593,662 B1 | * | 7/2003 | Pu et al. |
| 2004/0063246 A1 | * | 4/2004 | Karnezos ................. 438/108 |

* cited by examiner

Primary Examiner—Long Pham
Assistant Examiner—Dilinh Nguyen
(74) Attorney, Agent, or Firm—Keating & Bennett LLP

(57) ABSTRACT

An integrated circuit package is provided. The package has a substrate having first and second surfaces and a plurality of conductive traces therebetween. A stacked semiconductor die apparatus is coupled to the substrate. The stacked semiconductor die apparatus includes a first semiconductor die, a second semiconductor die stacked on the first semiconductor die and a shield disposed between the first and second semiconductor dice. A plurality of wire bonds connect the first and second semiconductor dice to ones of the conductive traces of the substrate. At least one encapsulating material encapsulates the wire bonds, the first semiconductor die and the second semiconductor die. A ball grid array is disposed on the second surface of the substrate such that bumps of the ball grid array are in electrical connection with ones of the conductive traces.

15 Claims, 14 Drawing Sheets

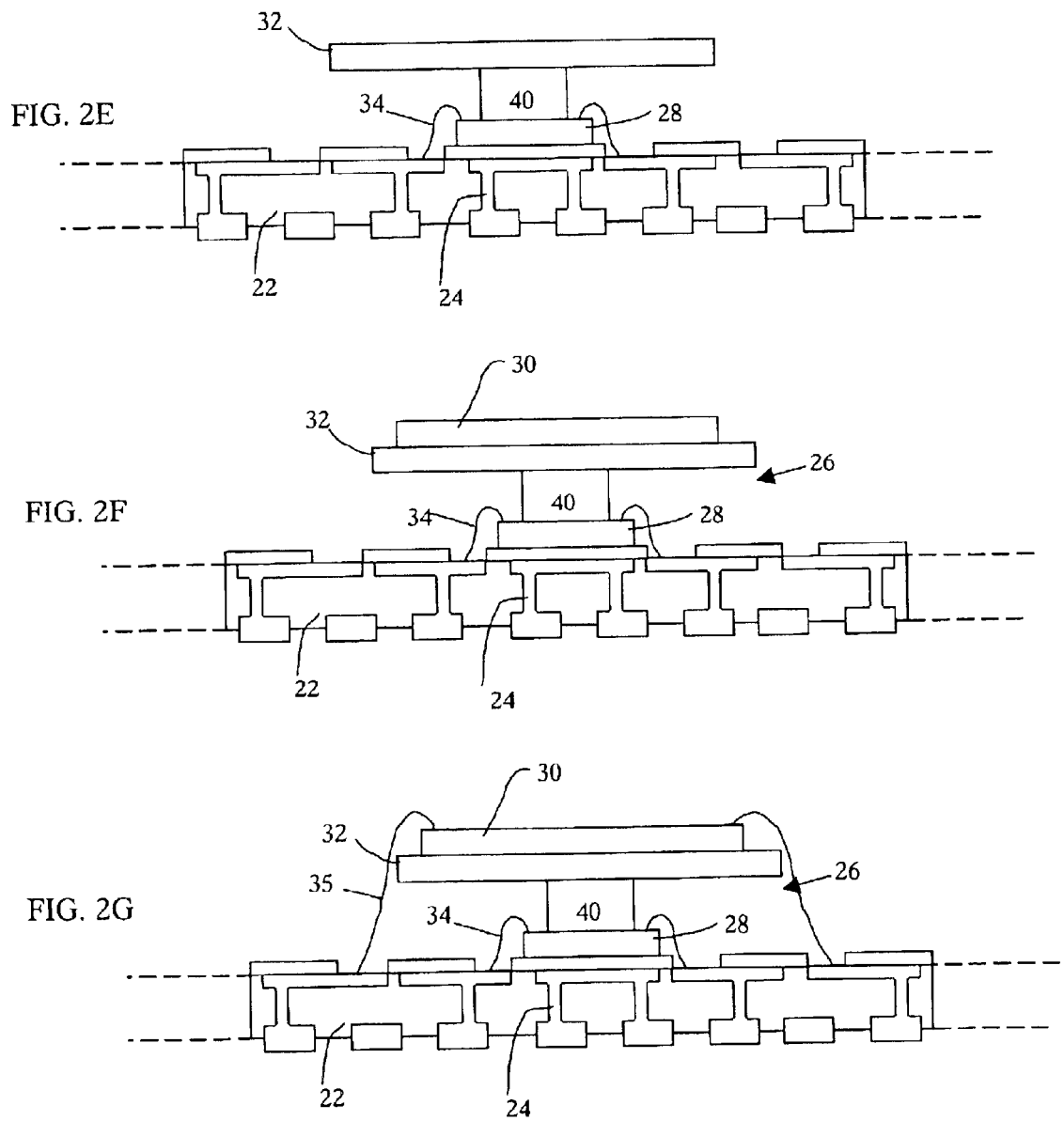

BALL GRID ARRAY PACKAGE WITH SHIELDING

FIELD OF THE INVENTION

The present invention relates in general to integrated circuit packaging, and more particularly to an improved ball grid array package with radio frequency shielding capability.

BACKGROUND OF THE INVENTION

High performance integrated circuit (IC) packages are well known in the art. Improvements in IC packages are driven by industry demands for increased thermal and electrical performance and decreased size and cost of manufacture.

In general, array packaging such as Plastic Ball Grid Array (PBGA) packages provide a high density of interconnects relative to the surface area of the package. Typical PBGA packages include a substrate and a semiconductor die attached to the substrate by a die adhesive. Gold wire bonds electrically connect the die to metal traces on the substrate and the wire bonds and die are encapsulated in a molding material. Solder balls are disposed on the bottom surface of the substrate for signal transfer.

Conventional molding materials are plastic and serve to encapsulate, protect and provide support for the semiconductor die and wire bonds. While such structures have achieved considerable use, these packages fail to provide shielding, which is desirable for certain applications such as radio frequency (RF) applications. The plastic molding materials are substantially transparent to radio frequency electromagnetic radiation and consequently radio frequency interference signals or electromagnetic interference signals are permitted to enter and escape from the IC package.

With increasing performance and package density demands, the interference signals emitted from IC packages is also increasing. These signals are undesirable as they may interfere with other components or may exceed federally regulated levels.

IC package shield systems and packages including shields have found use in these applications, in order to inhibit the interference signals from entering or exiting the IC package. Conventional shields include a metallic cap which is adhered to the outside of IC package in order to cover the package. While the incorporation of such a cap is generally satisfactory for shielding the IC package, there is an associated increase in the size of the package, resulting in a disadvantageous increase in required motherboard area when assembled with a motherboard.

It is therefore an object of an aspect of the present invention to provide a ball grid array package with enhanced shielding properties to obviate or mitigate at least some of the disadvantages of the prior art.

SUMMARY OF THE INVENTION

In one aspect of the present invention, there is provided an integrated circuit package. The package has a substrate having first and second surfaces and a plurality of conductive traces therebetween. A stacked semiconductor die apparatus is coupled to the substrate. The stacked semiconductor die apparatus includes a first semiconductor die, a second semiconductor die stacked on the first semiconductor die and a shield disposed between the first and second semiconductor dice. A plurality of wire bonds connect the first and second semiconductor dice to ones of the conductive traces of the substrate. At least one encapsulating material encapsulates the wire bonds, the first semiconductor die and the second semiconductor die. A ball grid array is disposed on the second surface of the substrate such that bumps of the ball grid array are in electrical connection with ones of the conductive traces.

Advantageously, the shield is integrated into the package for shielding radio frequency interference signals or electromagnetic interference signals to or from the first semiconductor die. A relatively low profile shielded package is thereby provided. Also, since the shield is made, at least partly, of a metal, thermal dissipation is improved in the package.

In one particular embodiment, the shield is a substrate material, referred to as a second substrate, with circuitry and a metal plane on a backside thereof. The metal plane provides shielding while the circuitry allows further routing, lending to the flexibility of the package design. Also, the second substrate can be electrically connected to the bottom substrate. In another embodiment, passive components are integrated into the package.

BRIEF DESCRIPTION OF THE DRAWINGS

The invention will be better understood with reference to the following description and to the drawings, in which:

FIGS. 2A to 2J show the processing steps for manufacturing the ball grid array package of FIG. 1;

DETAILED DESCRIPTION OF THE PREFERRED EMBODIMENTS

Figure 1:
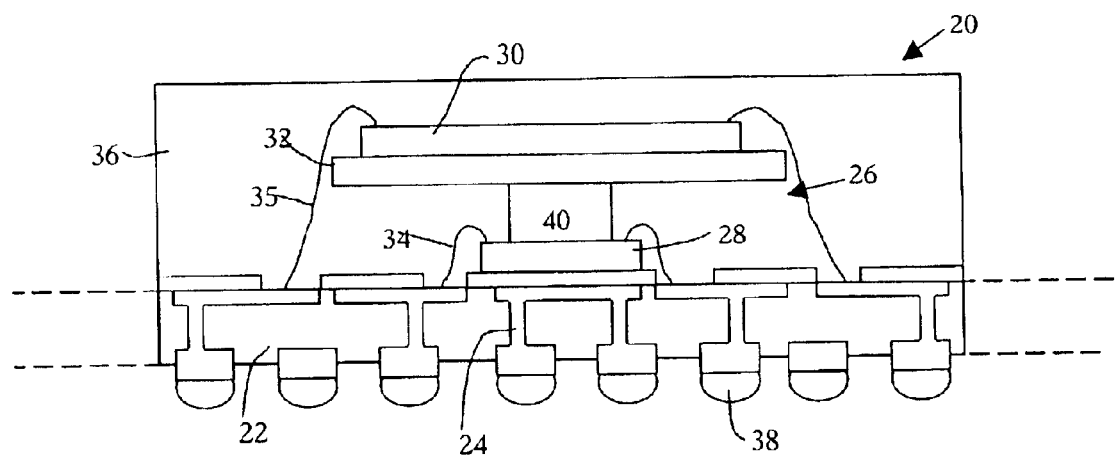
FIG. 1 is a sectional side view of a shielded ball grid array integrated circuit package according to an embodiment of the present invention.

Reference is first made to FIG. 1 in which a partial sectional side view of a ball grid array integrated circuit package according to an embodiment of the present invention is shown. The ball grid array package is indicated generally by the numeral 20. The package 20 has a substrate 22 having first and second surfaces and a plurality of conductive traces 24 therebetween. A stacked semiconductor die apparatus 26 is coupled to the substrate 24. The stacked semiconductor die apparatus 26 includes a first semiconductor die 28, a second semiconductor die 30 stacked on the first semiconductor die 28 and a shield 32 disposed between the first and second semiconductor dice 28, 30, respectively. A plurality of wire bonds 34, 35 connect the first and second semiconductor dice 28, 30, respectively, to ones of the conductive traces 24 of the substrate 22. At least one encapsulating material 36 encapsulates the wire bonds 34, 35, the first semiconductor die 28 and the second semiconductor die 30. A ball grid array 38 is disposed on the second surface of the substrate such that bumps of the ball grid array 38 are in electrical connection with ones of the conductive traces 24.

Figure 2A:
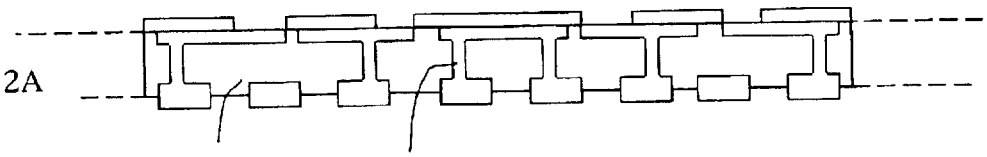

The ball grid array integrated circuit package 20 will now be described in more detail with reference to FIGS. 2A to 2I to describe the processing steps for manufacturing the shielded integrated circuit package, according to the first embodiment of the present invention. Referring first to FIG. 2A, a substrate 22 of a BT resin/glass epoxy printed circuit board with conductive traces 24 for signal transfer is shown. Thermal vias through the substrate 22 are provided under the position where the first semiconductor die 28 is mounted. A solder mask is located on the lower surface of the substrate, with portions of the conductive traces (interconnects) exposed. The substrate 22 is in the form of a strip for producing a number of BGA units. Only one such unit is depicted in FIG. 2A, portions of adjacent units being shown by stippled lines.

Figure 2B:
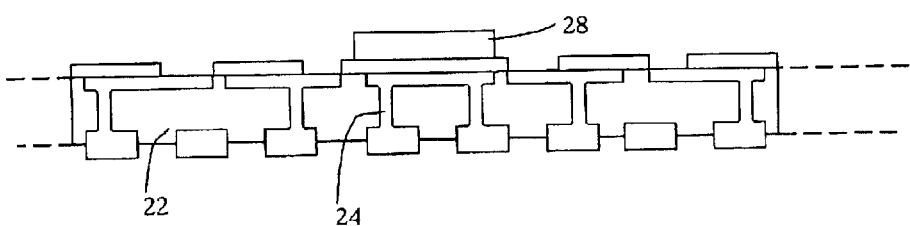
Figure 2C:
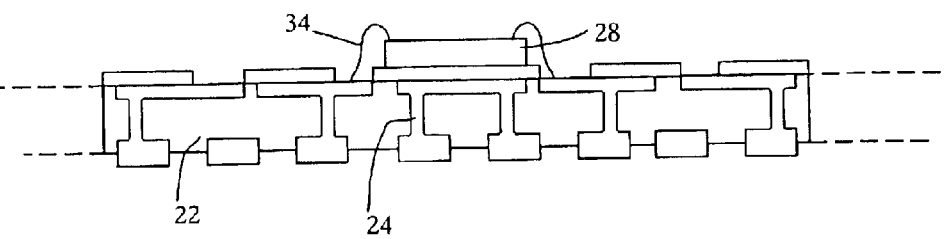

The first singulated semiconductor die 28 is conventionally mounted to an upper surface of the substrate 22 using a suitable die attach epoxy and the epoxy is cured (FIG. 2B). In the present embodiment, the first semiconductor die 28 is an RF semiconductor die. The semiconductor die 28 includes a conductive pad array formed thereon and gold wires 34 are bonded between the conductive pads of the array and some of the conductive traces 24 on the substrate 22 using conventional wire bonding techniques (FIG. 2C).

Figure 2D:
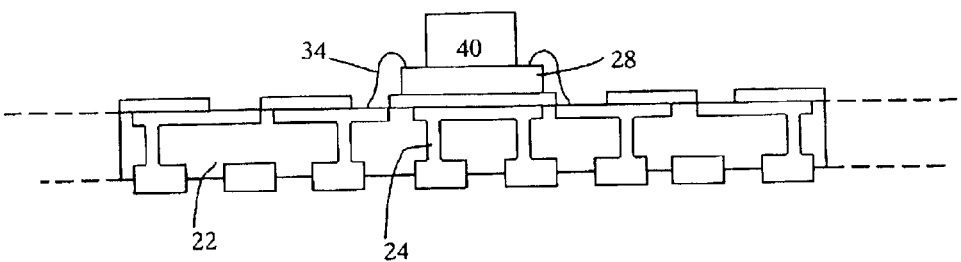

Next, the spacer 40 is mounted to a portion of the top of the first semiconductor die 28 (FIG. 2D). In the present embodiment, the spacer 40 is silicon and is attached to the first semiconductor die 28 using a non-conductive epoxy.

The shield 32 is then fixed to the top of the spacer 40 using epoxy (FIG. 2E). The shield 32 is a metal plate for shielding the first semiconductor die 28.

Next, the second semiconductor die 30 is conventionally mounted to an upper surface of the shield 32 using a die attach epoxy and the epoxy is cured (FIG. 2F). The second semiconductor die 30 includes a conductive pad array formed thereon and gold wires 35 are bonded between the conductive pads of the array and some of the conductive traces 24 on the substrate 22 using conventional wire bonding techniques (FIG. 2G).

Figure 2H:
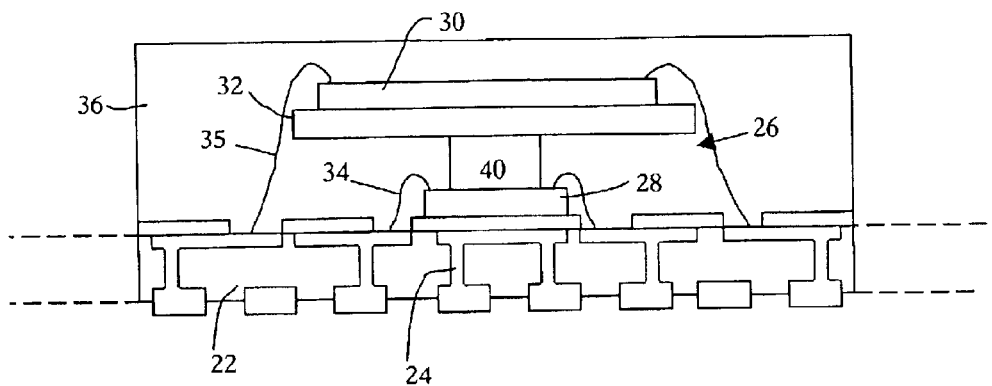

The package 20 is then encapsulated in an overmold compound (encapsulating material) 36 (FIG. 2H). The encapsulating material 36 surrounds the wire bonds 34, 35, the first and second semiconductor dice 28, 30, respectively, the spacer 40 and the shield 32, thereby protecting the wire bonds 34, 35 as well as the first and second semiconductor dice 28, 30, respectively.

Figure 2I:
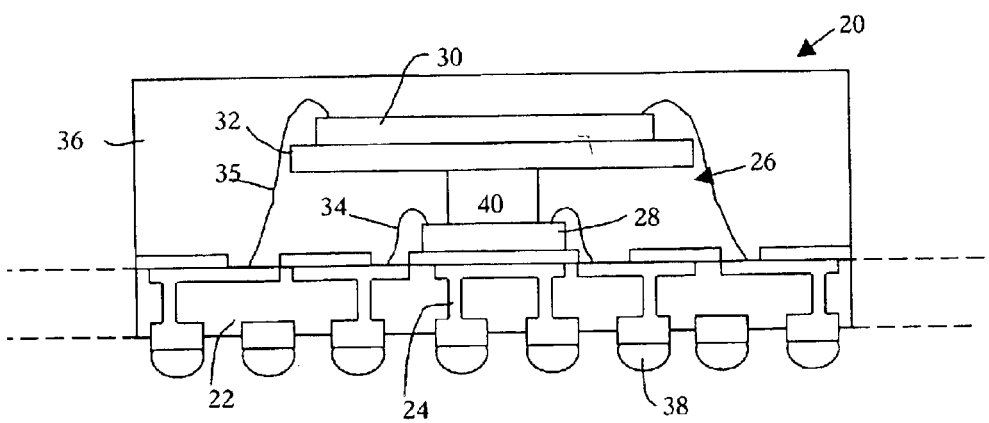

The ball grid array (BGA) 38 of solder balls, also referred to as solder bumps, is formed on the lower surface of the substrate 22 by conventional positioning (FIG. 2I). To attach the solder balls, a flux is added to the balls prior to placement and, after placement, the solder balls are reflowed using known reflow techniques. The solder balls are thereby connected to the conductive traces 24 of the substrate 22 and through the gold wires 34, 35 to the first and second semiconductor die 28, 30, respectively. The solder balls provide signal and power connections as well as ground connections for the semiconductor dice 28, 30.

Figure 2J:
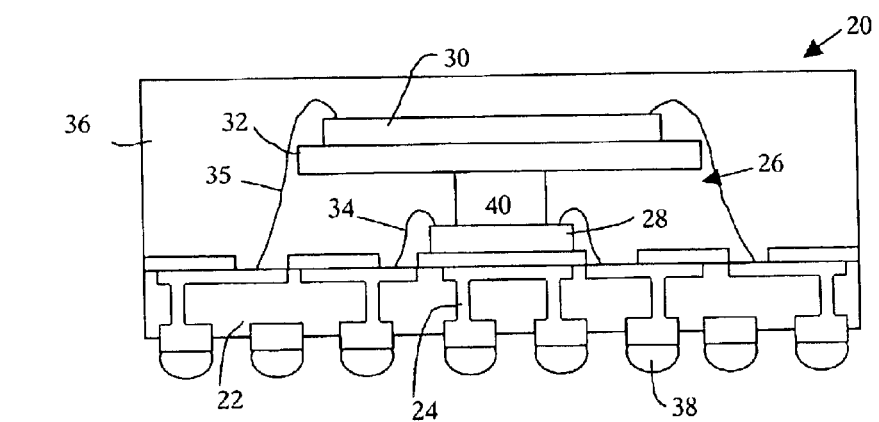

Singulation of the individual BGA units from the strip is then performed either by saw singulation or die punching, resulting in the configuration shown in FIG. 2J. Thus, the individual BGA package 20 is isolated from the strip.

Figure 3A:
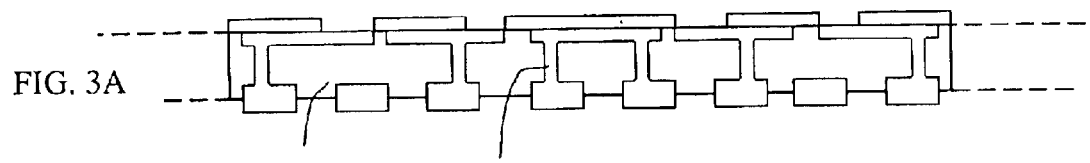
FIGS. 3A to 3J show the processing steps for manufacturing a ball grid array package in accordance with a second embodiment of the present invention.
Figure 3B:
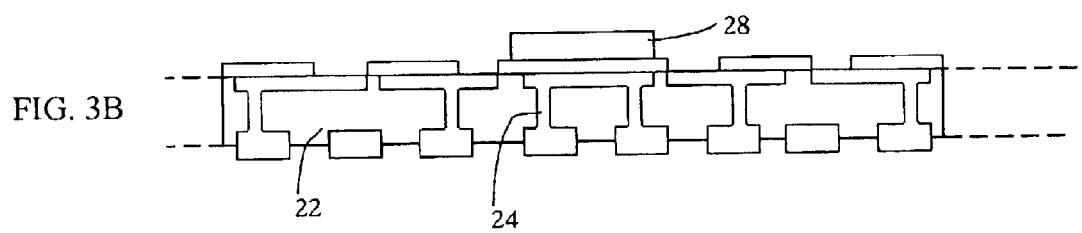
Figure 3C:
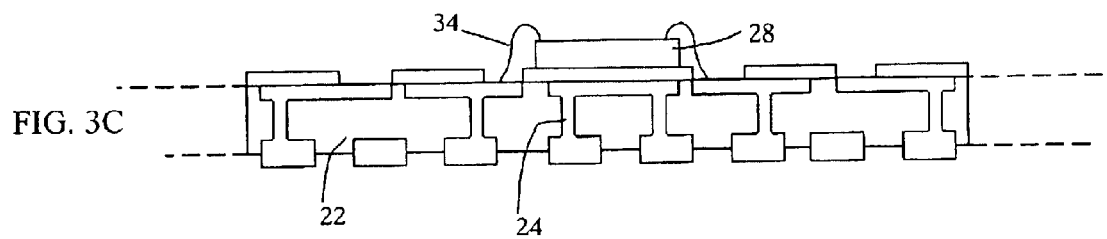

Reference is now made to FIGS. 3A to 3J to describe the processing steps for manufacturing a shielded integrated circuit package, according to a second embodiment of the present invention. FIGS. 3A to 3C are similar to FIGS. 2A to 2C and need not be further described herein.

Figure 3D:
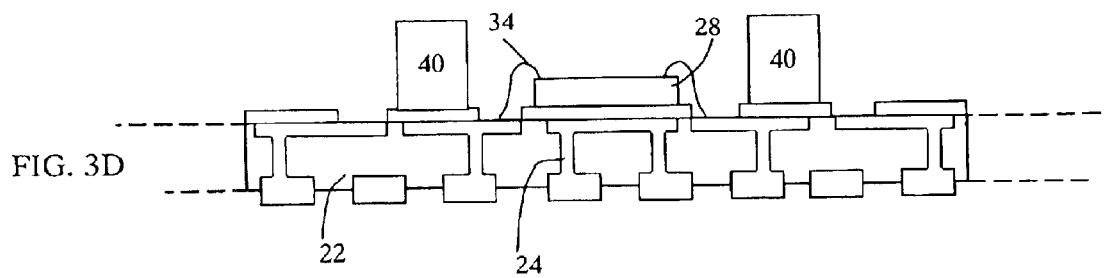
Figure 3E:
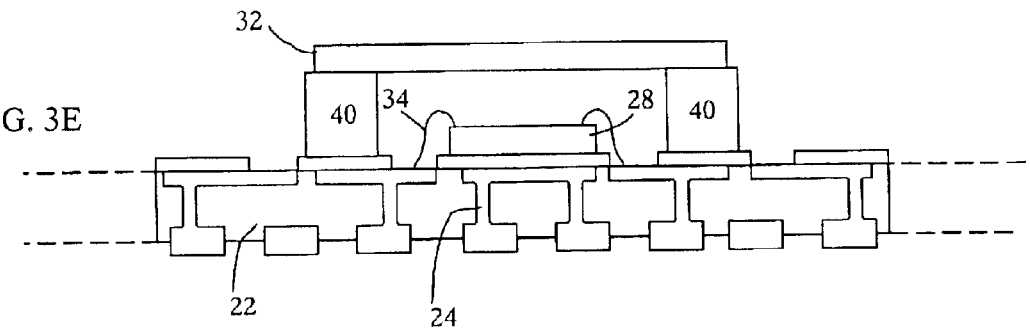

After gold wires 34 are bonded between the first semiconductor die 28 and some of the conductive traces 24 of the substrate 22, a pair of spacers 40 are mounted to a portion of the upper surface of the substrate 22, on opposing sides of the first semiconductor die 28 (FIG. 3D). The spacers 40 are silicon and are attached to the substrate 22 using a non-conductive epoxy. The shield 32 is then fixed to the top surface of each of the spacers 40 using epoxy (FIG. 3E). The shield 32 is a metal plate for shielding the first semiconductor die 28.

Figure 3F:
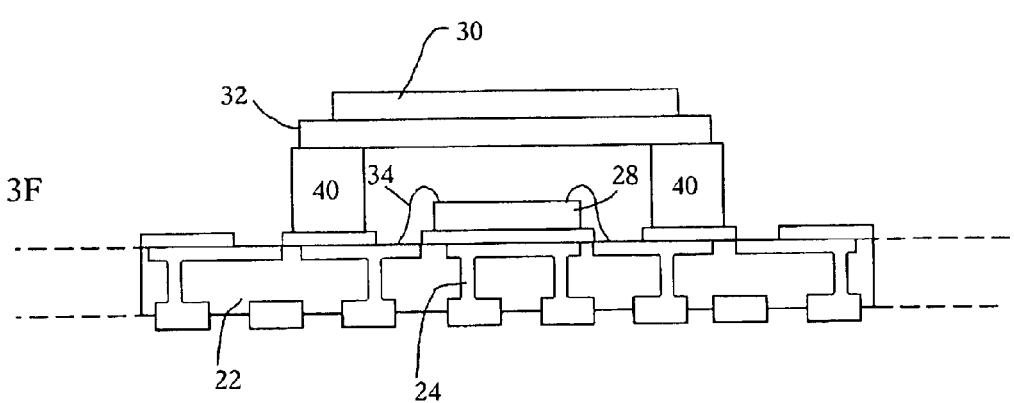
Figure 3G:
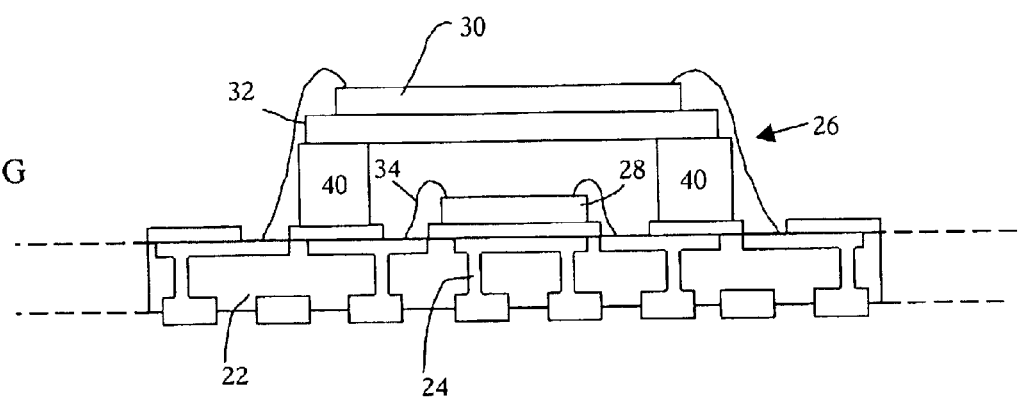

Next, the second semiconductor die 30 is conventionally mounted to an upper surface of the shield 32 using a die attach epoxy and the epoxy is cured (FIG. 3F). Similar to the first-described embodiment, the second semiconductor die 30 includes a conductive pad array formed thereon and gold wires 35 are bonded between the conductive pads of the array and some of the conductive traces 24 on the substrate 22 using conventional wire bonding techniques (FIG. 3G).

Figure 3H:
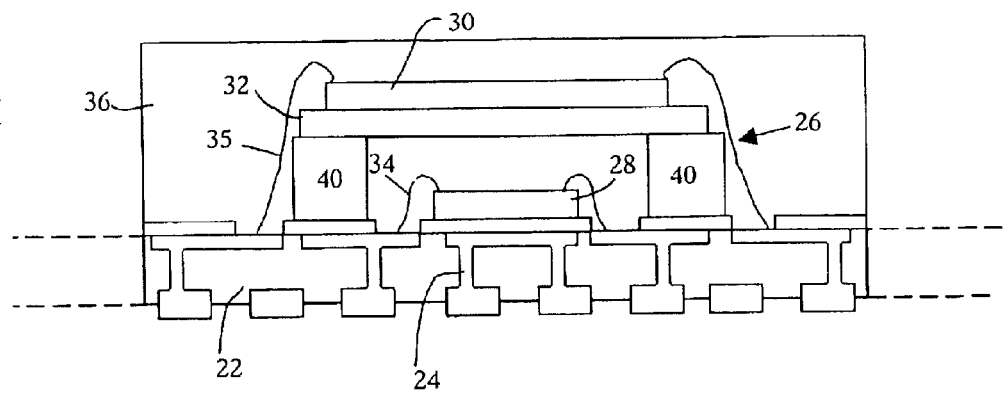
Figure 3I:
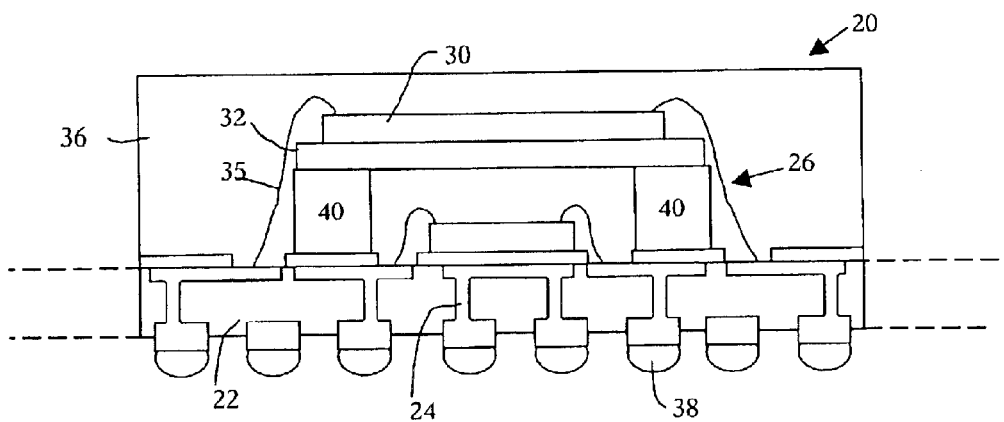

The package 20 is then encapsulated in an overmold compound (encapsulating material) 36 (FIG. 3H). As described above, the encapsulating material 36 surrounds the wire bonds 34, 35, the first and second semiconductor dice 28, 30, respectively, the spacer 40 and the shield 32, thereby protecting the wire bonds 34, 35 as well as the first and second semiconductor dice 28, 30, respectively.

Figure 3J:
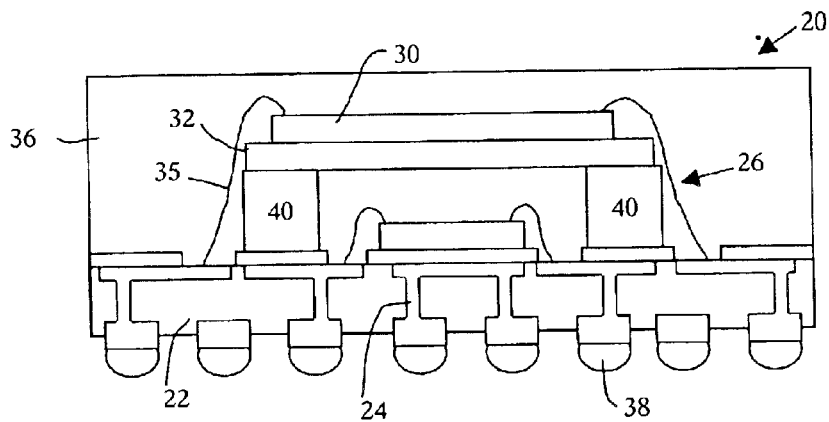

The ball grid array (BGA) 38 of solder balls is then formed on the lower surface of the substrate 22 by conventional positioning (FIG. 3I) and the individual BGA units are singulated (FIG. 3J). As in the first-described embodiment, the present embodiment includes a stacked semiconductor die apparatus 26 in which the first and second semiconductor dice 28, 30, respectively are in a stacked formation. In the present embodiment, however, the spacers 40 are mounted on the substrate 22, rather than on the first semiconductor die 28.

Reference is now made to FIGS. 4A to 4J to describe the processing steps for manufacturing a shielded integrated circuit package according to a third embodiment of the present invention.

Figure 4A:
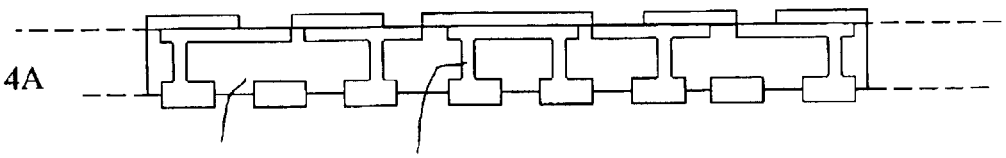
FIGS. 4A to 4J show the processing steps for manufacturing a ball grid array package in accordance with a third embodiment of the present invention.

Referring first to FIG. 4A, a substrate 22 of a BT resin/glass epoxy printed circuit board with conductive traces 24 for signal transfer is shown. The substrate of the present embodiment is similar to that of the embodiment of FIG. 2A, described above.

Figure 4B:
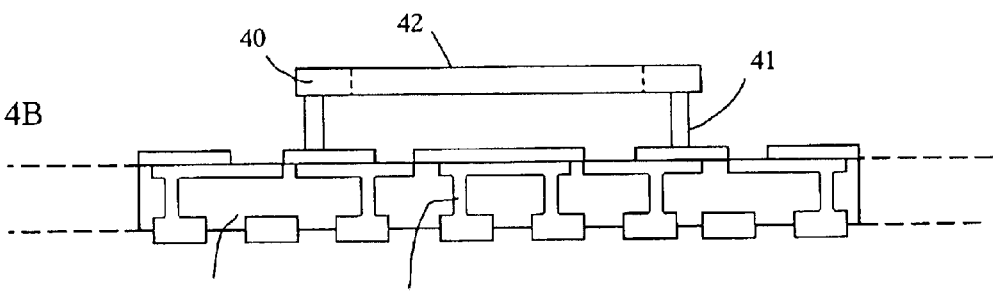

In the present embodiment, a spacer 40 is attached to the substrate 22 by SMT (surface mount technology) process. This process includes the application of solder paste, spacer 40 pick and place and solder reflow. Alternatively, the process includes epoxy application and spacer 40 pick and place, followed by epoxy curing (FIG. 4B). In the present embodiment, the spacer 40 has four legs 41 which are attached to the substrate 22 and a top portion 42 that includes an opening therein to facilitate semiconductor die attach to the substrate 22 and subsequent wire bonding.

Figure 4C:
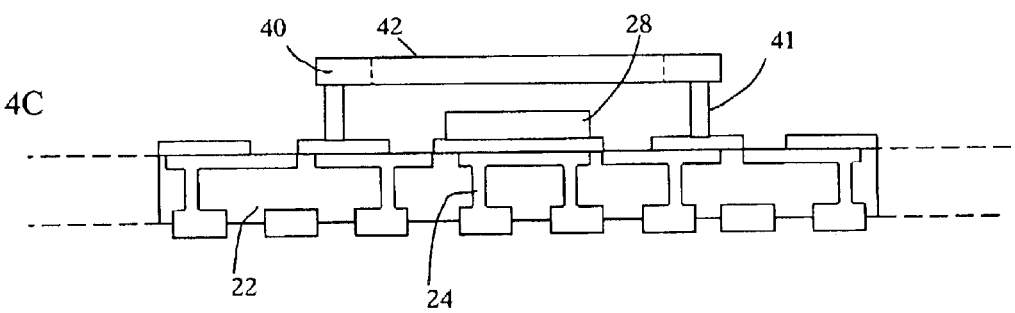
Figure 4D:
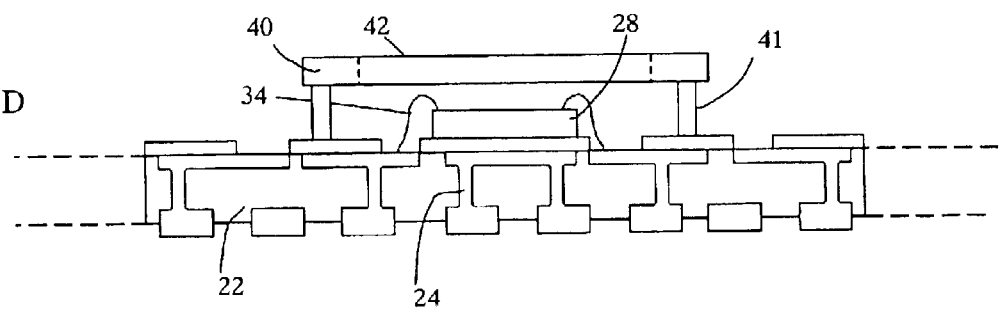

A first singulated semiconductor die 28 is mounted to an upper surface of the substrate 22 using a conductive die attach epoxy and the epoxy is cured (FIG. 4C). The semiconductor die 28 includes a conductive pad array formed thereon and gold wires 34 are bonded between the conductive pads of the array and some of the conductive traces 24 on the substrate 22 using conventional wire bonding techniques (FIG. 4D).

Figure 4E:
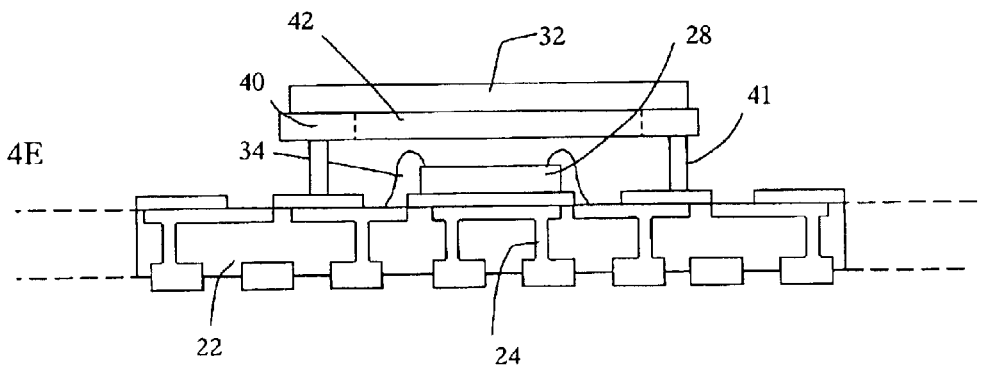

Next, a shield 32 is fixed to the top portion 42 of the spacer 40 using epoxy (FIG. 4E). In the present embodiment, the shield 32 is a second substrate, similar to the substrate 22, and includes a metal plate on the bottom side thereof for shielding the first semiconductor die 28. It will be understood that the second substrate includes circuitry, lending flexibility to the package design.

Figure 4F:
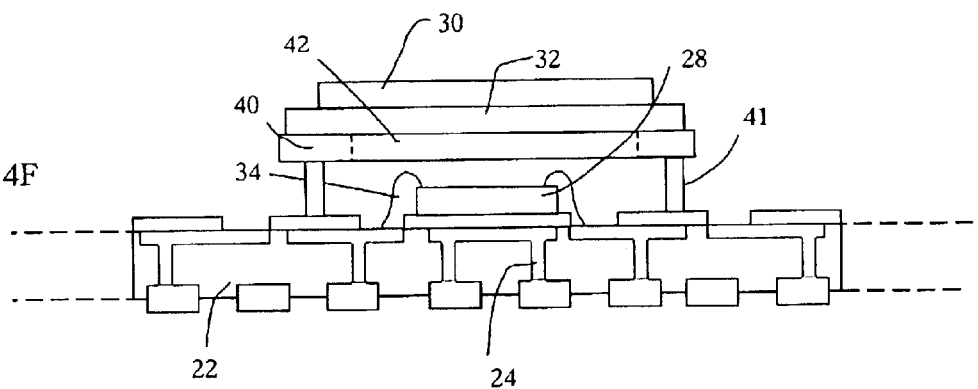
Figure 4G:
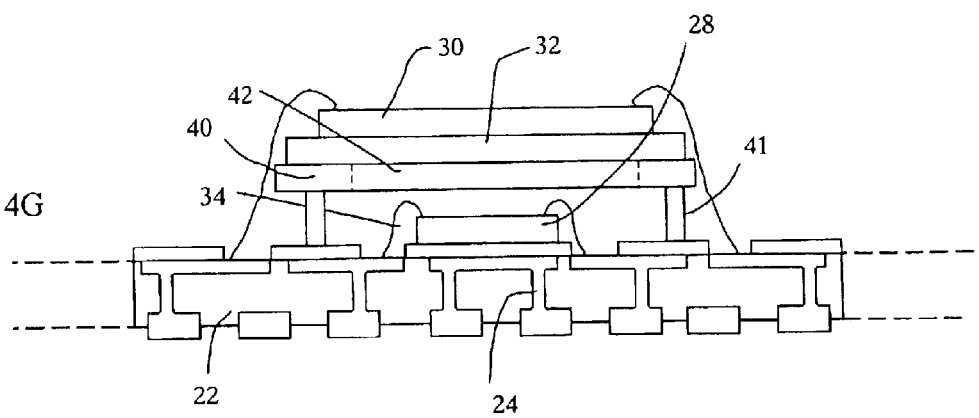

Next, the second semiconductor die 30 is conventionally mounted to an upper surface of the shield 32 using a die attach epoxy and the epoxy is cured (FIG. 4F). The second semiconductor die 30 includes a conductive pad array formed thereon. Gold wires 35 are bonded between conductive pads of the array and some of the conductive traces 24 on the substrate 22 and between conductive pads of the array and circuitry of the shield 32 (second substrate), using conventional wire bonding techniques (FIG. 4G).

Figure 4H:
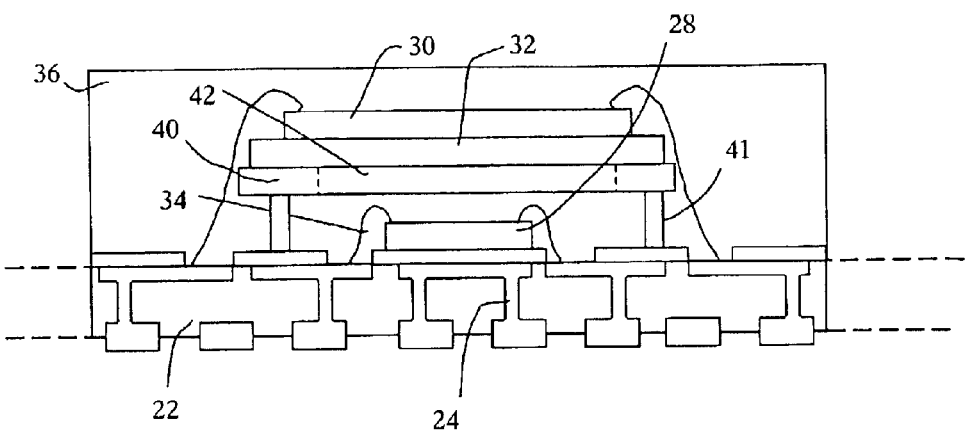
Figure 4I:
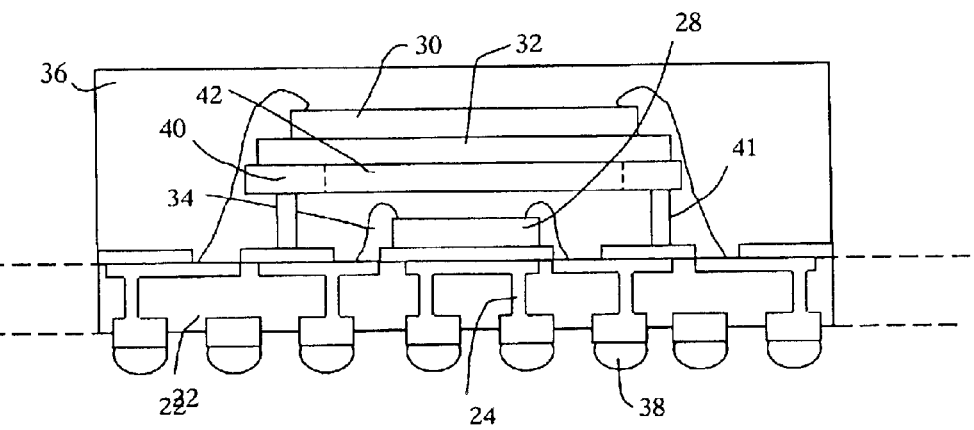

The package 20 is then encapsulated in an overmold compound (encapsulating material) 36 (FIG. 4H). The encapsulating material 36 surrounds the wire bonds 34, 35, the first and second semiconductor dice 28, 30, respectively, the spacer 40 and the shield 32, thereby protecting the wire bonds 34, 35 as well as the first and second semiconductor dice 28, 30, respectively.

Figure 4J:
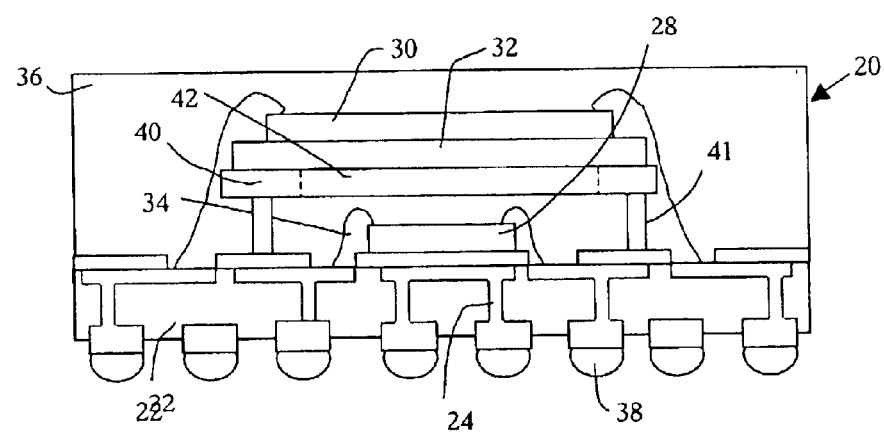

The ball grid array (BGA) 38 of solder balls is formed on the lower surface of the substrate 22 by conventional positioning (FIG. 4I) and the individual BGA units are singulated from the (FIG. 4J).

Figure 5A:
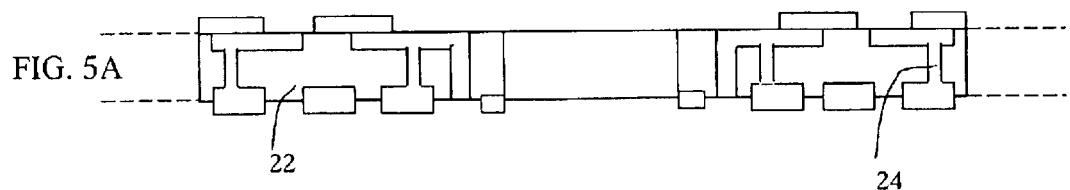
FIGS. 5A to 5J show the processing steps for manufacturing a ball grid array package in accordance with a fourth embodiment of the present invention.

Reference is now made to FIGS. 5A to 5J to describe the processing steps for manufacturing a shielded integrated circuit package according to a fourth embodiment of the present invention. Referring first to FIG. 5A, a substrate 22 of a BT resin/glass epoxy printed circuit board with conductive traces 24 for signal transfer is shown. In the present embodiment, the substrate 22 has a cavity extending through the thickness thereof. A solder mask is located on the upper and lower surface of the substrate 22, with portions of the conductive traces 24 (interconnects) exposed. The substrate 22 is in the form of a strip for producing a number of BGA units. Only one such unit is depicted in FIG. 5A, portions of adjacent units being shown by stippled lines.

Figure 5B:
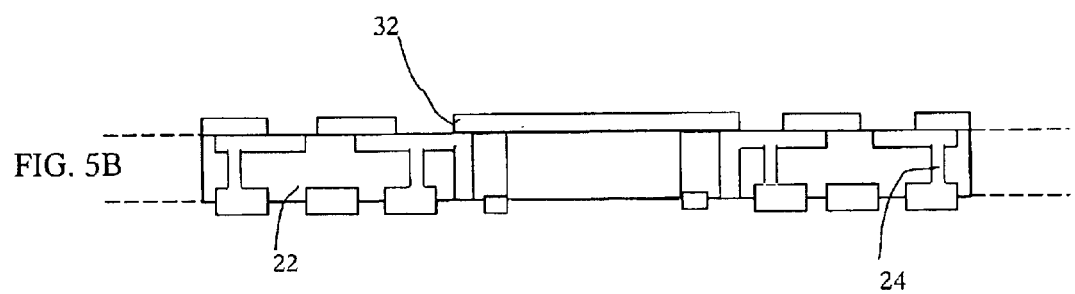
Figure 5C:
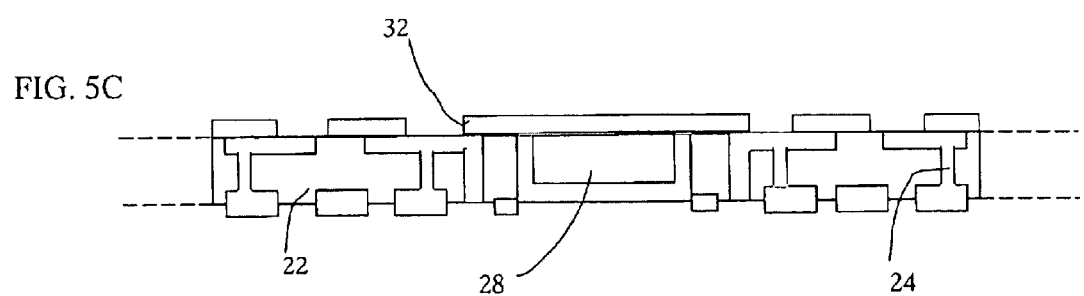

The shield 32 is then fixed to the top surface of the substrate 22, over the cavity in the substrate 22 by solder reflow (FIG. 5B). The shield 32 is a metal plate for shielding the first semiconductor die 28.

Figure 5D:
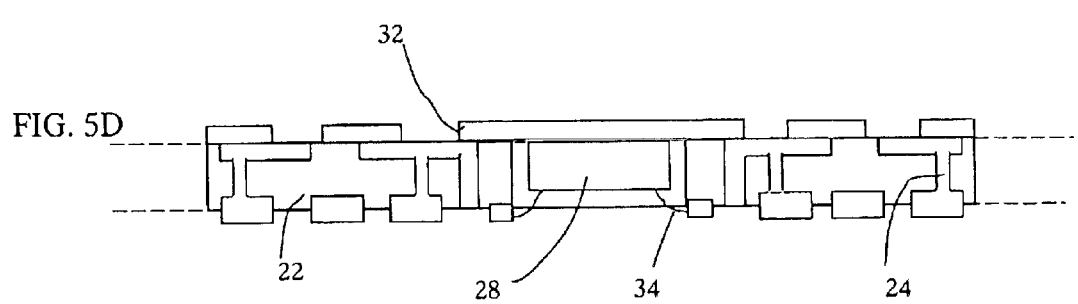

The first semiconductor die 28 is conventionally mounted to the lower surface of the shield 32, using a conductive die attach epoxy and the epoxy is cured (FIG. 6C). As shown in the figures, the first semiconductor die 28 is mounted in the cavity of the substrate 22. The semiconductor die 28 includes a conductive pad array formed thereon and gold wires 34 are bonded between the conductive pads of the array and some of the conductive traces 24 on the substrate 22 using conventional wire bonding techniques (FIG. 5D).

Figure 5E:
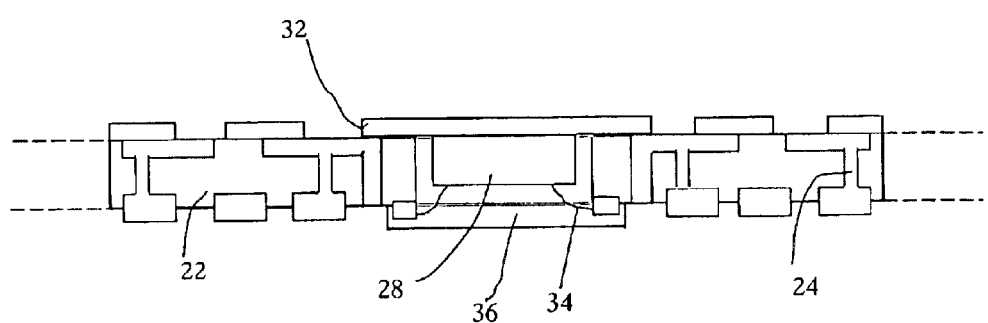

The first semiconductor die 28 is then encapsulated in an encapsulating material 36 such as an overmold compound or a glob-top material (FIG. 5E). The encapsulating material 36 surrounds the wire bonds 34 and the first semiconductor die 28, thereby protecting the wire bonds 34 as well as the first semiconductor die 28. The wire bonds 34 are electrically isolated in the encapsulating material 36.

Figure 5F:
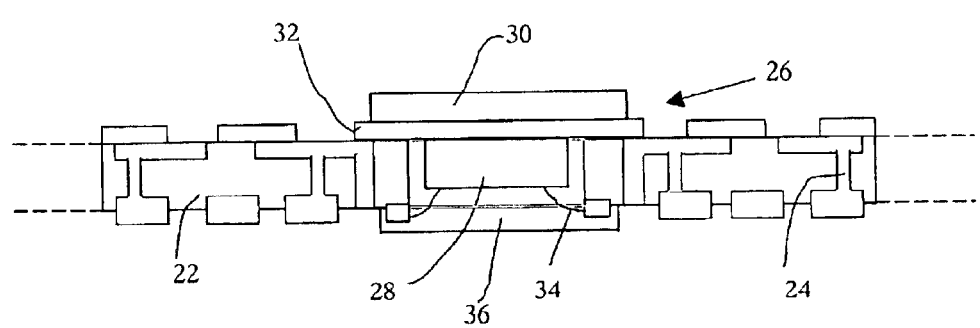
Figure 5G:
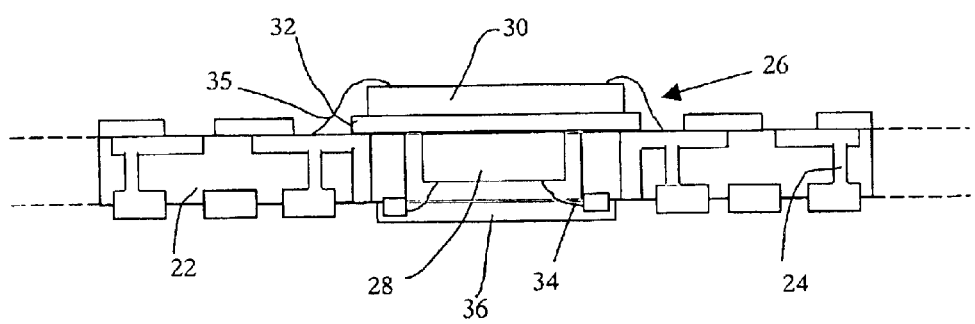

Next, the second semiconductor die 30 is conventionally mounted to an upper surface of the shield 32 using a die attach epoxy and the epoxy is cured (FIG. 5F). The second semiconductor die 30 includes a conductive pad array formed thereon and gold wires 35 are bonded between the conductive pads of the array and some of the conductive traces 24 on the substrate 22 using conventional wire bonding techniques (FIG. 5G). Clearly the shield 32 acts as a die attach pad for the first and second semiconductor dice 28, 30, respectively.

Figure 5H:
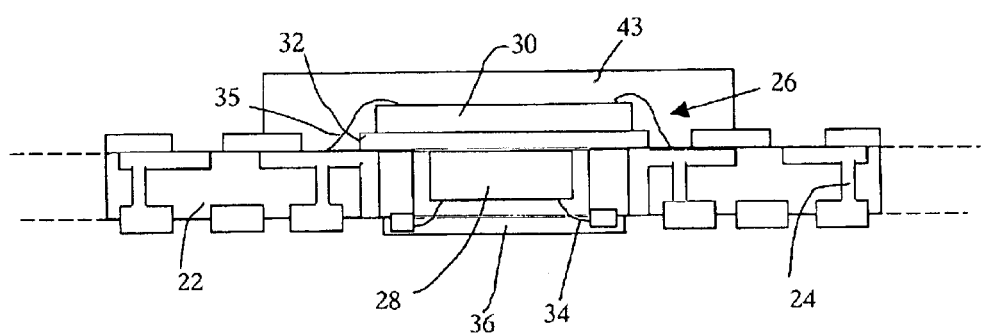
Figure 5I:
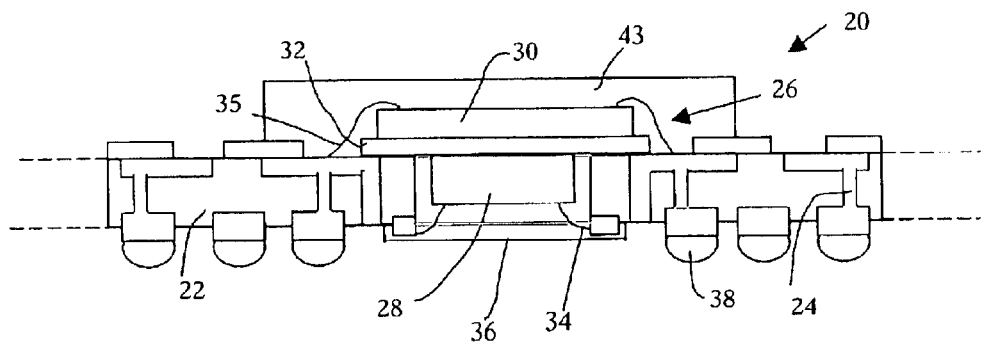

The second semiconductor die 30 is then encapsulated in an encapsulating material 43, such as an overmold compound or a glob top material (FIG. 5H). The encapsulating material 43 surrounds and protects the wire bonds 35 and the second semiconductor die 30. As in the above-described embodiments, the present embodiment includes a stacked semiconductor die apparatus 26 in which the first and second semiconductor dice 28, 30, respectively are in a stacked formation. In the present embodiment, however, a spacer is not necessary in the stacked semiconductor die apparatus 26.

Figure 5J:
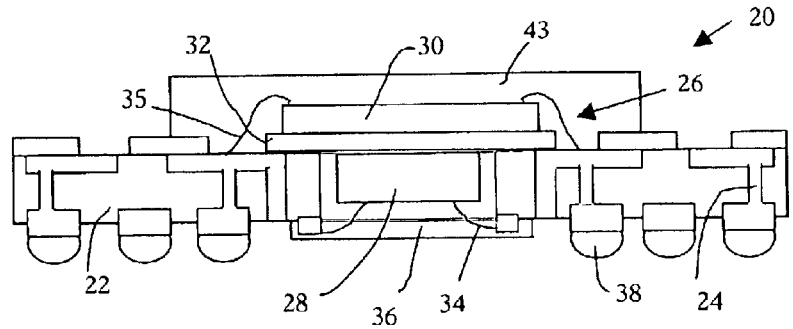

The ball grid array (BGA) 38 of solder balls is then formed on the lower surface of the substrate 22 by conventional positioning (FIG. 5I) and the individual BGA units are singulated from the strip (FIG. 5J). Thus, the individual BGA package 20 is isolated.

Figure 6:
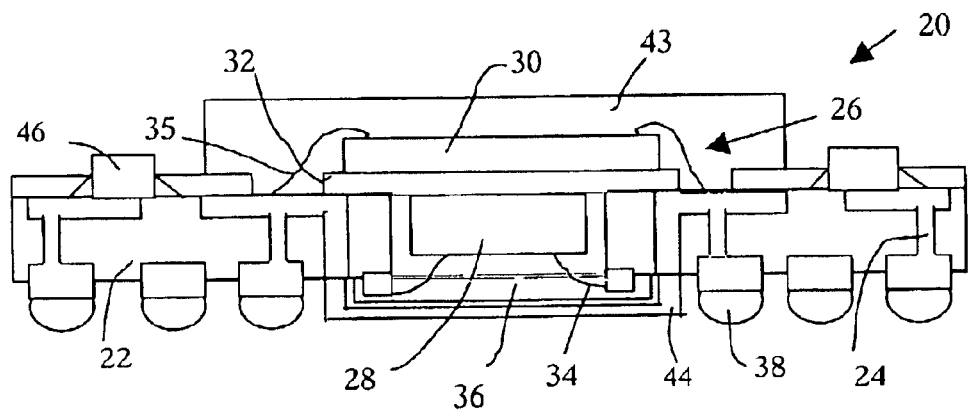
FIG. 6 shows a sectional side view of a shielded ball grid array package in accordance with a fifth embodiment of the present invention.

Alternative embodiments and variations are possible. For example, a second shield 44 can be added to the ball grid array package of FIGS. 5A to 5I, as shown in FIG. 6. In the embodiment shown in FIG. 6, the second shield 44 is appropriately mounted to lower surface of the substrate 22 using conductive epoxy and the epoxy is cured. The second shield 44 is mounted over the encapsulating material 36 to further shield the first semiconductor die 28. The second shield 44 is connected to the first shield 32 by certain conductive traces through the substrate 22. In another embodiment, the second shield 44 is not connected to the first shield 32.

Passive components 46 can be pre-solder mounted to the substrate 22 prior to mounting the shield 32. These passive components 46 can include, for example, capacitors, inductors, and resistors. Such passive components are shown in FIG. 6.

Figure 7:
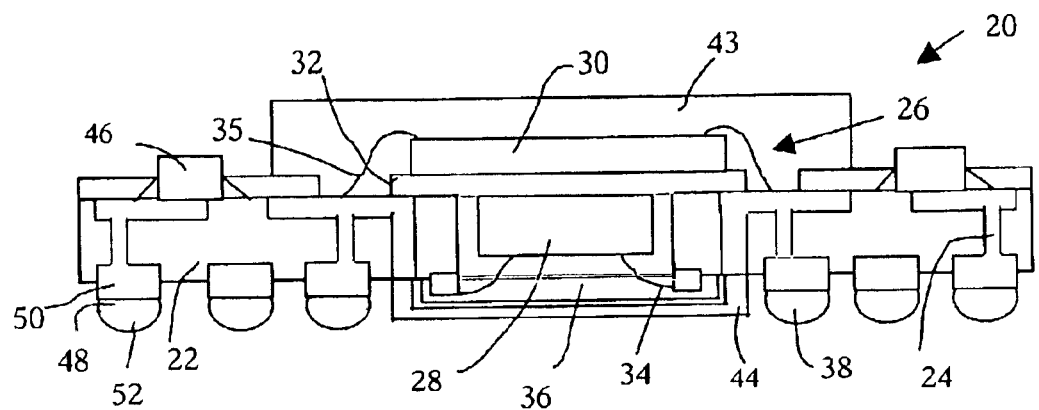
FIG. 7 shows a sectional side view of a shielded ball grid array package in accordance with a sixth embodiment of the present invention.

In a variation of the above-described embodiments, the ball grid array 38 of solder balls is fixed to the lower surface of the substrate as shown in FIG. 7 and described below. First a eutectic solder paste 48 is applied onto a solder pad 50 on the substrate 22, followed by reflowing the solder 48 to flatten (referred to as coining). A high lead solder 52 is then reflowed on the pre-applied eutectic solder 48 to complete the solder ball grid array 38.

Still other embodiments and variations may occur to those of skill in the art. For example, rather than using separate spacer and shield components, as described in FIGS. 1 and 2, the spacer and shield components can be a T-shaped unitary metal piece made by etching or stamping. In a variation to the embodiment of FIGS. 3A to 3J, the spacer can be a ring spacer, a pair of spacers, as described, or any suitable number of spacers fixed to the upper surface of the substrate and disposed around the die attach pad. Also, the spacer can be silicon, metal, ceramic or any suitable material. All such embodiments and variations are believed to be within the scope and sphere of the present invention.

What is claimed is:

1. An integrated circuit package comprising:
   a substrate having first and second surfaces and a plurality of conductive traces therebetween;
   a stacked semiconductor die apparatus coupled to said substrate, said stacked semiconductor die apparatus comprising a first semiconductor die, a second semiconductor die stacked on said first semiconductor die and a metallic shield disposed between the first and second semiconductor dice, the first semiconductor die being mounted on said first surface of said substrate, the metallic shield being larger than both the first semiconductor die and the second semiconductor die for shielding radio frequency interference signals or electromagnetic interference signals to or from the first semiconductor die, the stacked semiconductor die apparatus further comprising a spacer fixed to said first semiconductor die, an opposing side of said spacer being fixed to said metallic shield;

a plurality of wire bonds connecting said first and second semiconductor dice to ones of said conductive traces of said substrate;

at least one encapsulating material for encapsulating said wire bonds, said first semiconductor die and said second semiconductor die; and a ball grid array disposed on said second surface of said substrate, bumps of said ball grid array being in electrical connection with ones of said conductive traces; wherein said second semiconductor die is fixed directly to said metallic shield.

2. The integrated circuit package according to claim 1, wherein said first and second semiconductor dice are spaced apart by at least one spacer and by said metallic shield.

3. An integrated circuit package comprising:

a substrate having first and second surfaces and a plurality of conductive traces therebetween;

a stacked semiconductor die apparatus coupled to said substrate, said stacked semiconductor die apparatus comprising a first semiconductor die, a second semiconductor die stacked on said first semiconductor die and a metallic shield disposed between the first and second semiconductor dice, said first semiconductor die being mounted on said first surface of said substrate, the metallic shield being larger than both the first semiconductor die and the second semiconductor die for shielding radio frequency interference signals or electromagnetic interference signals to or from the first semiconductor die;

a plurality of wire bonds connecting said first and second semiconductor dice to ones of said conductive traces of said substrate;

at least one encapsulating material for encapsulating said wire bonds, said first semiconductor die and said second semiconductor die; and a ball grid array disposed on said second surface of said substrate, bumps of said ball grid array being in electrical connection with ones of said conductive traces; wherein said stacked semiconductor die apparatus further comprises at least one spacer fixed to said first surface of said substrate, said metallic shield being mounted on said at least one spacer such that said metallic shield is spaced from said first semiconductor die.

4. The integrated circuit package according to claim 3, wherein said at least one metallic shield comprises a ring spacer surrounding said first semiconductor die.

5. The integrated circuit package according to claim 3, wherein said second semiconductor die is mounted to said metallic shield such that said first and second semiconductor dice are spaced apart and stacked.

6. An integrated circuit package comprising:

a substrate having first and second surfaces and a plurality of conductive traces therebetween;

a stacked semiconductor die apparatus coupled to the substrate, the stacked semiconductor die apparatus comprising a first semiconductor die mounted on the first surface of the substrate, a second semiconductor die stacked on said first semiconductor die and a metallic shield disposed between the first and second semiconductor dice, the metallic shield being mounted on a pair of spacers mounted on said substrate on either side of said first semiconductor die, the pair of spacers being mounted on said first surface of said substrate, such that the metallic shield is spaced from the first semiconductor die;

a plurality of wire bonds connecting said first and second semiconductor dice to ones of said conductive traces of said substrate;

at least one encapsulating material for encapsulating said wire bonds, said first semiconductor die and said second semiconductor die; and a ball grid array disposed on said second surface of said substrate, bumps of said ball grid array being in electrical connection with ones of said conductive traces.

7. An integrated circuit package comprising:

a substrate having first and second surfaces and a plurality of conductive traces therebetween;

a stacked semiconductor die apparatus coupled to the substrate, the stacked semiconductor die apparatus comprising a first semiconductor die mounted on the first surface of the substrate, a second semiconductor die stacked on said first semiconductor die, a metallic shield disposed between the first and second semiconductor dice, the metallic shield being mounted on a plurality of spacers mounted on said substrate, around said first semiconductor die, said plurality of spacers being mounted on said first surface of said substrate, such that the metallic shield is spaced from the first semiconductor die;

a plurality of wire bonds connecting said first and second semiconductor dice to ones of said conductive traces of said substrate;

at least one encapsulating material for encapsulating said wire bonds, said first semiconductor die and said second semiconductor die; and a ball grid array disposed on said second surface of said substrate, bumps of said ball grid array being in electrical connection with ones of said conductive traces.

8. An integrated circuit package comprising:

a substrate having first and second surfaces, a plurality of conductive traces therebetween and a cavity therein;

a stacked semiconductor die apparatus coupled to said substrate, said stacked semiconductor die apparatus comprising a first semiconductor die, a second semiconductor die stacked on said first semiconductor die and a metallic shield disposed between the first and second semiconductor die, a portion of said metallic shield being mounted on said first surface of said substrate such that said metallic shield being is disposed over said cavity, and said first semiconductor die being mounted to a first surface of said metallic shield whereby said first semiconductor die is disposed in said cavity, the metallic shield being larger than both the first semiconductor die and the second semiconductor die for shielding radio frequency interference signals or electromagnetic interference signals to or from the first semiconductor die;

a plurality of wire bonds connecting said first and second semiconductor dice to ones of said conductive traces of said substrate;

at least one encapsulating material for encapsulating said wire bonds, said first semiconductor die and said second semiconductor die; and a ball grid array disposed on said second surface of said substrate, bumps of said ball grid array being in electrical connection with ones of said conductive traces; wherein said second semiconductor die is mounted directly on an opposing surface of said metallic shield.

9. The integrated circuit package according to claim 8, wherein said encapsulating material is a glob-top material.

10. An integrated circuit package comprising:

a substrate having first and second surfaces, a plurality of conductive traces therebetween and a cavity therein;

a stacked semiconductor die apparatus coupled to said substrate, said stacked semiconductor die apparatus comprising a first semiconductor die, a second semiconductor die stacked on said first semiconductor die and a metallic shield disposed between the first and second semiconductor dice, a portion of said metallic shield being mounted on said first surface of said substrate such that said metallic shield being is disposed over said cavity, and said first semiconductor die being mounted to a first surface of said metallic shield whereby said first semiconductor die is disposed in said cavity, the metallic shield being larger than both the first semiconductor die and the second semiconductor die for shielding radio frequency interference signals or electromagnetic interference signals to or from the first semiconductor die;

a plurality of wire bonds connecting said first and second semiconductor dice to ones of said conductive traces of said substrate;

at least one encapsulating material for encapsulating said wire bonds, said first semiconductor die and said second semiconductor die; and a ball grid array disposed on said second surface of said substrate, bumps of said ball grid array being in electrical connection with ones of said conductive traces; wherein said second semiconductor die is mounted on an opposing surface of said metallic shield, and wherein said at least one encapsulating material comprises a first encapsulant surrounding the first semiconductor die, and a second encapsulant surrounding the second semiconductor die.

11. The integrated circuit package according to claim 10, wherein the first encapsulant material is different from the second encapsulant material.

12. An integrated circuit package comprising:

a substrate having first and second surfaces and a plurality of conductive traces therebetween, the substrate further having a cavity therein;

a stacked semiconductor die apparatus coupled to said substrate, said stacked semiconductor die apparatus comprising a first semiconductor die, a second semiconductor die stacked on said first semiconductor die and a metallic shield disposed between the first and second semiconductor dice, a portion of said metallic shield being mounted on said first surface of said substrate such that said metallic shield is disposed over said cavity, and said first semiconductor die is mounted to a first surface of said metallic shield whereby said first semiconductor die is disposed in said cavity;

a second metallic shield coupled to said second surface of said substrate and covering said cavity;

a plurality of wire bonds connecting said first and second semiconductor dice to ones of said conductive traces of said substrate;

at least one encapsulating material for encapsulating said wire bonds, said first semiconductor die and said second semiconductor die;

a ball grid array disposed on said second surface of said substrate, bumps of said ball grid array being in electrical connection with ones of said conductive traces, said second semiconductor die is mounted on an opposing surface of said metallic shield.

13. The integrated circuit package according to claim 12, wherein said substrate further comprises a plurality of solder pads electrically connected to said ones of said conductive traces, said bumps of said ball grid array being disposed on said solder pads.

14. The integrated circuit package according to claim 13, wherein said bumps of said ball grid array comprise a first solder on each of said solder pads and a second solder disposed on said first solder.

15. The integrated circuit package according to claim 14, wherein said first solder comprises a eutectic solder and said second solder comprises a high lead solder.

* * * * *